(12) United States Patent
Menut et al.

(10) Patent No.: US 6,673,703 B2
(45) Date of Patent: Jan. 6, 2004

(54) METHOD OF FABRICATING AN INTEGRATED CIRCUIT

(75) Inventors: Olivier Menut, Grenoble (FR); Herve Jaouen, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/171,102

(22) Filed: Jun. 13, 2002

(65) Prior Publication Data

US 2003/0013262 A1 Jan. 16, 2003

(30) Foreign Application Priority Data

Jun. 13, 2001 (FR) .............................. 01 07717

(51) Int. Cl.[7] .................. H01L 21/265; H01L 21/8238; H01L 21/8239; H01L 21/8228; H01L 21/04
(52) U.S. Cl. ................. 438/522; 438/202; 438/203; 438/234; 438/322; 438/338; 438/342; 438/372; 438/510
(58) Field of Search ................. 438/510, 202, 438/203, 234, 322, 338, 342, 372, 522

(56) References Cited

U.S. PATENT DOCUMENTS 5,118,634 A * 6/1992 Neudeck et al.
5,134,454 A * 7/1992 Neudeck et al.
5,488,002 A    1/1996 Kimura et al.
5,668,397 A * 9/1997 Davis et al.
6,049,098 A * 4/2000 Sato
2002/0115228 A1 * 8/2002 Kiyota

FOREIGN PATENT DOCUMENTS

EP    0 395 358 A2   10/1990
EP    0 429 834 A1   6/1991

OTHER PUBLICATIONS

Preliminary Search Report dated Mar. 11, 2002 for French Application No. 0107717.

* cited by examiner

Primary Examiner—John F. Niebling
Assistant Examiner—Stanetta Isaac
(74) Attorney, Agent, or Firm—Lisa K. Jorgenson; Jon A. Gibbons; Fleit, Kain, Gibbons, Gutman, Bongini & Bianco P.L.

(57) ABSTRACT

A method of fabricating an integrated circuit including a monocrystalline silicon substrate, a layer of polycrystalline silicon on the top surface of the substrate and doped with at least two dopants with different rates of diffusion, in which method annealing is performed at a temperature and for a time such that a first dopant diffuses into a first zone and a second dopant diffuses into a second zone larger than the first zone.

20 Claims, 2 Drawing Sheets

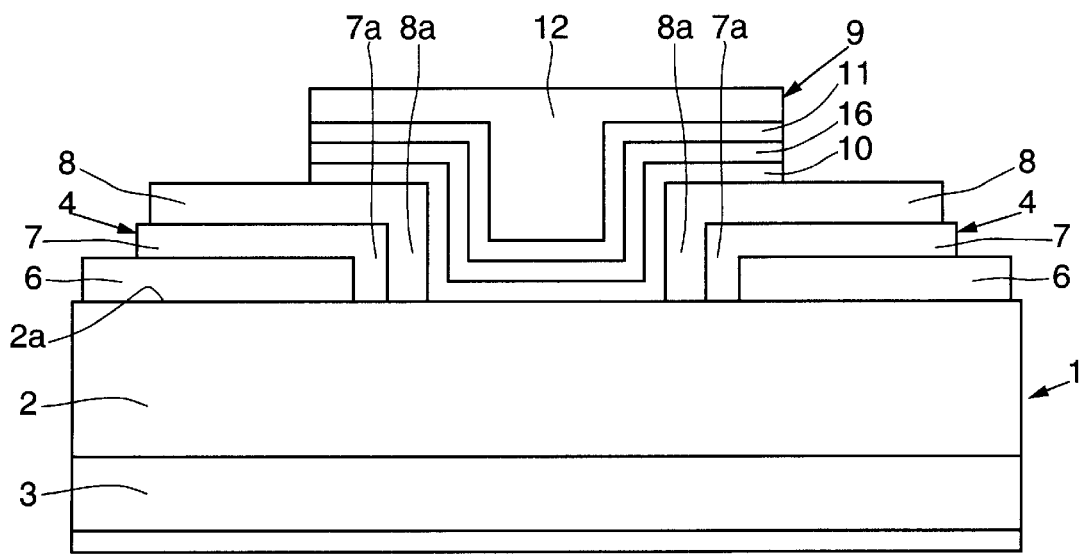
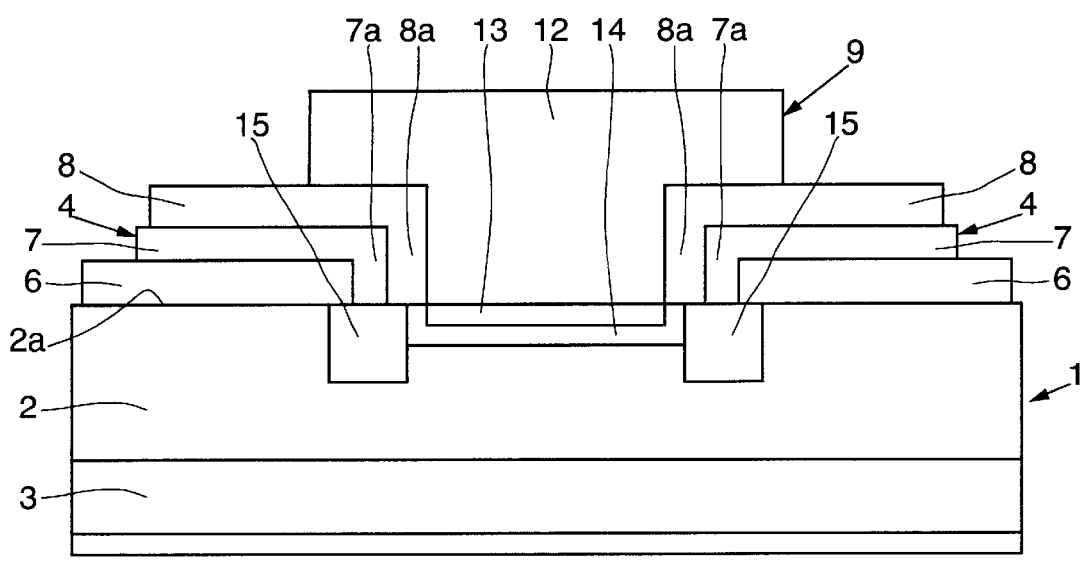

METHOD OF FABRICATING AN INTEGRATED CIRCUIT

CROSS REFERENCE TO RELATED APPLICATIONS

This application is based upon and claims priority from prior French Patent Application No. 0107717, filed Jun. 13, 2001, the disclosure of which is hereby incorporated by reference in its entirety.

BACKGROUND OF THE INVENTION

1. Field of the Invention

The present invention generally relates to integrated circuits and their fabrication. More particularly, the invention relates to fabricating bipolar transistors, diodes, and other types of active components.

2. Description of Related Art

In prior art of vertical bipolar transistors, the collector, the base, and the emitter are formed by superposing layers vertically, i.e. in the direction normal to the surface of the substrate.

Doping some layers by ion implantation, which is known in the art, takes place after forming the layers. Ion implantation is effected by bombarding the top surface of an integrated circuit wafer with dopant ions in the direction of the layers to be doped, the ions traveling through a certain thickness of material and then stops. Although ion implantation is useful, it is not without its shortcomings. One shortcoming is that ion implantation modifies the crystal structure of the monocrystalline silicon used in the layers or the substrate, and even destroys it locally by creating defects that compromise the operation of the integrated circuit. Accordingly, a need exists to overcome this shortcoming.

SUMMARY OF THE INVENTION

The present invention is a simple method of fabricating a self-aligned integrated circuit active component with high quality monocrystalline silicon areas.

The fabrication method in accordance with one embodiment of the present invention is for fabricating an integrated circuit including a monocrystalline silicon substrate having a top surface, at least one layer of polycrystalline silicon on the top surface of the substrate and doped with at least two dopants with different rates of diffusion. Annealing is performed at a temperature and for a time such that a first dopant diffuses into a first zone and a second dopant diffuses into a second zone larger than the first zone, the first dopant dominating in the first zone. Stated differently, the first dopant exists in a higher concentration in the first zone than the concentration of the other dopants.

In the case of a bipolar transistor, the emitter and the intrinsic base are therefore formed by an annealing step that is economical and easy to control.

In one embodiment of the invention a buried layer can first be formed in the substrate.

In one embodiment of the invention a bipolar transistor is fabricated, for example using the BICMOS technology. The first zone forms the intrinsic emitter and the second zone forms the intrinsic base. The extrinsic base is formed during annealing in a third zone adjacent the second zone.

In one embodiment of the invention a well is formed to provide access to the buried layer from the top surface of the substrate.

In another embodiment, the first dopant is arsenic and the second dopant is boron.

In the case of a PNP bipolar transistor, the first dopant can be antimony and the second dopant can be phosphorus.

In another embodiment of the invention a diode disposed in a well formed in the substrate is fabricated.

To be more specific, an insulative layer is deposited on the top surface of the substrate, after which a first opening is excavated in the insulative layer. A layer of polysilicon is then deposited over the whole of the surface, after which the polysilicon layer is excavated to form a smaller second opening inside the first opening so that the edges of the second opening are of polysilicon and in contact with the top surface of the substrate. A top insulative layer is then deposited over the whole of the surface, after which a smaller third opening is excavated inside the second opening to expose the bottom of the third opening, with insulative material edges. This forms an emitter window.

Then a thick layer of polysilicon is deposited, consisting of a plurality of sublayers depending on the gas mixtures that are used to deposit the polysilicon. The thick layer of polysilicon includes a thin first sublayer, for example of the order of 100 angstrom units thick, doped with a first dopant and in contact with the top surface of the substrate in the bottom of the emitter window, and then a second sublayer doped with a second dopant, and then a third sublayer doped with the first dopant. The polysilicon layer is then etched away except inside the emitter window and an adjoining region.

The sublayers are doped in real time, at the same time as depositing the layer of polysilicon, by controlling the gas mixtures present in the reactor in which the integrated circuit is formed. For example, for doping with arsenic, arsine is introduced.

The subsequent annealing step causes fast downward diffusion of the second dopant, including through the first sublayer, and slower diffusion of the first dopant, which becomes dominant in the whole of the polysilicon layer, including in the second sublayer, and in the first zone of the substrate, adjoining the bottom of the emitter window. The faster diffusing second dopant is dominant in the second zone which is outside the first zone but nevertheless close to the bottom of the emitter window. The second zone is in contact with the third zone, which forms the extrinsic base.

As an alternative to the above, a supplementary sublayer of undoped polysilicon is provided in the thick doped silicon layer, the supplementary layer being disposed between the first and second sublayers and forming a kind of screen for slightly delaying the diffusion of the second dopant into the substrate by increasing the distance between the second sublayer and the substrate.

In further variants, the sublayers of the thick layer of polysilicon is doped by implanting the sublayers at different energies to vary the implantation depth, implantation in polysilicon being free of the dislocation drawbacks encountered in monocrystalline silicon.

For example, a layer of polysilicon from 1000 to 3000 Å thick, for example of the order of 2000 Å thick, is provided, and sublayers from 30 to 200 Å thick, for example of the order of 100 Å thick. The dopant concentration can be of the order of $10^{20}$.

One advantage of the invention is that cleaning the bottom of the emitter window, which is generally carried out after excavating the emitter window, does not cause any wear and consequently does not reduce the thickness of the base, which is yet to be formed at this location, but causes very slight wear of the substrate, which has no harmful effect. This achieves improved control and improved reproducibility of the thickness of the base. Also, the slow and costly step of implanting the base in the substrate is eliminated.

The dimensions of the first and second zones are easily controlled by adjusting the annealing temperature and time; the temperature is of the order of 600 to 900° and the annealing time is of the order of a few minutes.

The invention has the further advantage that the intrinsic emitter and the intrinsic base are self-aligned in the sense that they are both formed by diffusing dopant from the emitter window. Finally, the method is extremely simple to put into practice using existing integrated circuit fabrication machines.

The integrated circuit in accordance with one aspect of the invention includes a monocrystalline silicon substrate having a top surface and at least one layer of polycrystalline silicon on the top surface of the substrate. The substrate has a first zone which is formed immediately under the polycrystalline silicon layer and in which a first dopant is dominant and a second zone around the first zone in which a second dopant having a different conductivity than the first dopant is dominant, the first and second dopants being also present in at least a portion of the polycrystalline silicon layer.

In one embodiment of the invention the substrate includes a third zone, flush with the top surface of the substrate, in contact with the second zone and doped with a third dopant whose conductivity is the same as that of the second dopant. The second and third dopants are advantageously identical. The third zone is advantageously more strongly doped than the second zone.

In one embodiment of the invention the first zone forms the intrinsic emitter of a bipolar transistor, the second zone forms the intrinsic base, and the third zone forms the extrinsic base of the same bipolar transistor.

BRIEF DESCRIPTION OF THE DRAWINGS

The subject matter which is regarded as the invention is particularly pointed out and distinctly claimed in the claims at the conclusion of the specification. The present invention will be better understood after reading the detailed description of a few embodiments given hereinafter by way of non-limiting example and illustrated by the accompanying drawings.

FIG. 3 is a variant of FIG. 2.

FIG. 4 is similar to FIG. 1, at a later fabrication stage.

DETAILED DESCRIPTION OF AN EMBODIMENT

Figure 1:
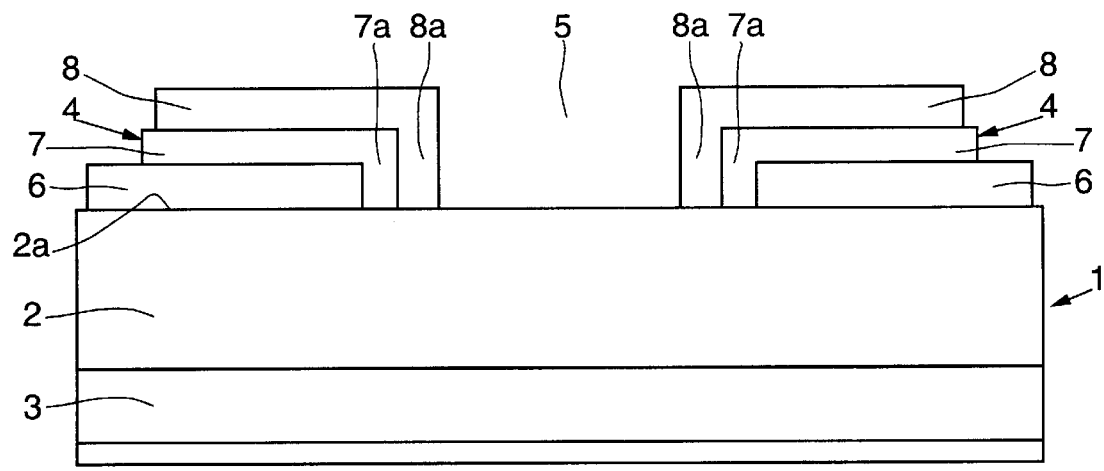
FIG. 1 is a view in section in a vertical plane of a portion of an integrated circuit wafer during fabrication.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

As can be seen in FIG. 1, an integrated circuit wafer 1, only a small portion of which is shown in FIG. 1, includes a monocrystalline silicon substrate 2 and a buried layer 3 of polycrystalline silicon, which is a conductor, formed within the substrate 2. The buried layer 3 can extend farther than shown in FIG. 1 in order to be connected to a vertical connection well, not shown. The substrate 2 has a top surface 2a on which is formed a stack 4 which leaves free an emitter window 5 which provides access to the top surface 2a of the substrate 2.

The stack 4 includes an insulative bottom layer 6, a conductive layer 7 and a top insulative layer 8. The bottom insulative layer 6 can be a layer of silicon oxide, silicon oxynitride, silicon nitride or a plurality of sublayers of those materials. Likewise the top insulative layer 8. The conductive layer 7 can be a layer of metal or advantageously a layer of polycrystalline silicon.

The stack 4 is formed by depositing the bottom insulative layer 6 over the whole of the top surface 2a of the substrate 2 and then etching a first window, for example by lithographic deposition of a resin mask. The conductive layer 7 is then deposited on the bottom insulative layer 6 and on the top surface 2a of the substrate 2 in the first opening. A second opening is then etched in the conductive layer 7, for example lithographically, the second opening being smaller than the first opening to leave, between the second opening and the bottom insulative layer 6, portions 7a of the conductive layer 7 in contact with the top surface 2a of the substrate 2 around at least a portion of the perimeter of the emitter window 5.

The conductive layer 7 is advantageously strongly doped as soon as it is deposited, for example with boron. In the case of polysilicon, it is doped by introducing a gas containing boron into the reactor in which the wafer 1 is placed when growing the layer 7. The top insulative layer 8 is then deposited over the whole of the surface of the conductive layer 7 and the top surface 2a of the substrate 2 in the second opening. A third opening smaller than the second opening is then etched, for example lithographically, to form the emitter window 5. The first, second and third openings are substantially concentric. Portions 8a of the top insulative layer 8 therefore remain at the edges of the emitter window 5 and insulate the emitter window 5 from the portions 7a of the conductive layer 7 all around the perimeter of the emitter window 5.

The top surface 2a of the substrate 2 in the emitter window 5 can then be cleaned by deoxidation to remove all traces of oxide from it. This cleaning can be effected using hydrofluoric acid HF.

Figure 2:
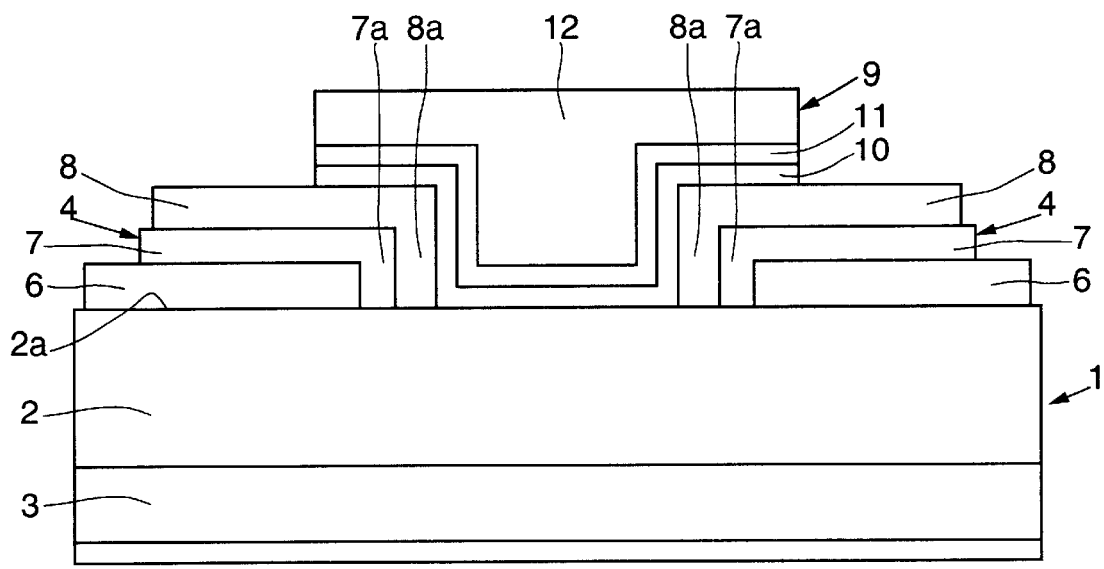
FIG. 2 is a view similar to FIG. 1 at a later stage.

In FIG. 2 it can be seen that a thick layer 9 of polycrystalline silicon is formed on the top surface 2a of the substrate 2 in the emitter window 5 and on the stack 4, to be more precise on the top insulative layer 8. The thick layer 9 is then etched away except on top of the emitter window 5 and over a certain width all around it, on top of the top insulative layer 8.

To be more precise, the thick layer 9 is formed of a plurality of differently doped sublayers. The first sublayer 10 in direct contact with the top surface 2a of the substrate 2 in the bottom of the emitter window 5 is doped with an N+ dopant, for example arsenic, in the case of an NPN transistor, and a P+ dopant, for example antimony, in the case of a PNP bipolar transistor.

The sublayer 11 formed on the sublayer 10 can include a P dopant, for example boron, in the case of an NPN transistor or an N dopant, for example phosphorus, in the case of a PNP transistor. It will be noted that the first dopant, for example arsenic or antimony, diffuses relatively slowly compared to the second dopant, respectively boron or phosphorus. The sublayer 12 can have the same composition as the sublayer 10.

The thick layer 9 as a whole is obtained in a single general step during which the wafer 1 is placed in a controlled-atmosphere reactor into which gases for depositing polycrystalline silicon are introduced, to which can be added gases for depositing dopants, such as arsine for depositing arsenic. The rate of deposition of the polycrystalline silicon being known, the introduction of the gases containing the dopants can be controlled to form the sublayer 10, the sublayer 11, and the sublayer 12 in a continuous manner. Doping does not slow down the deposition of the layer 9 and does not add any specific supplementary steps.

This is followed by an annealing step at a temperature of the order of 600 to 900° for 1 to 10 minutes, which yields the structure shown in FIG. 4. Annealing causes dopants to diffuse from the thick layer 9 toward the substrate 2 and homogenizes the dopants in the thick layer 9. The dopants present in large quantities in the portions 7a of the conductive layer 7 also diffuse into the substrate. There is thereby obtained in a zone 13 of the substrate 2, which is thin and whose size is limited to that of the emitter window 5, a portion of monocrystalline silicon doped with the first dopant, present in the sublayers 10 and 12 of the thick layer 9, and which migrates slowly. The zone 13 can also include a certain proportion of the second dopant, but with a lower concentration than the first dopant. It is important to note that the annealing operation may occur in one step or in multiple steps. In one embodiment, the annealing step is performed for the diffusion of the two or more dopants separately. And in another embodiment, a single annealing operation is performed for the diffusion of the two dopants simultaneously. Accordingly, in this second embodiment, the annealing operation causes the diffusion of a first dopant of the two dopants into a first zone and the diffusion of a second dopant of the two dopants into a second zone. By annealing the polycrystalline silicon at an adequate temperature and for an adequate time, the first dopant in the first zone has a higher concentration than the second dopant. In this embodiment, the second zone is larger than the first zone. The single annealing embodiment is typically faster, easier and less expensive to carry out than a multiple annealing step operation.

A second zone 14 of the substrate 2 under the first zone 13 and over the sides, surrounding it completely or almost completely, is dominated by the second dopant, which is present beforehand in the sublayer 11 of the thick layer 9 and migrates faster. Finally, a strongly doped zone 15 is formed by diffusion of dopants present in the portions 7a of the conductive layer 7, which are therefore placed in the substrate 2 under the portions 7a. The zones 14 and 15 are in contact, preferably direct contact. The zone 13 forms the intrinsic emitter of a bipolar transistor, the zone 14 forms the intrinsic base, and the zone 15 forms the extrinsic base, the collector being formed by the portion of the substrate 2 disposed between the zone 14 and the buried layer 3.

The shape of the emitter window 5 in a horizontal plane is not shown in the sectional views in the FIGs., but can be square, rectangular or a more complex shape. The portions 7a of the conductive layer 7 can remain over only one or more portions of the perimeter of the emitter window 5.

FIG. 3 is a variant of FIG. 2 and shows an intermediate sublayer 16 between the sublayers 10 and 11 of the thick layer 9 of polysilicon, the sublayer 16 being a layer of undoped polysilicon. This slows down the diffusion of the second dopant present in the sublayer 11, enabling its diffusion into the substrate 2 to be controlled.

The invention uses the different diffusion rates of two dopants to form the emitter and the base of a bipolar transistor or the junction of a diode. The difference in diffusion rate between boron and arsenic can be exploited to form an NPN bipolar transistor. The difference in diffusion rate between antimony and phosphorus can be exploited to form a PNP bipolar transistor. The base and the emitter are intrinsically self-aligned because they are formed by diffusion from the same emitter window. The profiles of the intrinsic base and of the intrinsic emitter are controlled entirely by diffusion, which eliminates costly and lengthy implantation steps, which can damage the crystal lattice of the substrate 2. An undoped polysilicon sublayer in the thick layer reduces the diffusion of the second dopant and therefore offers great flexibility of growth. Finally, the method is simple to put into practice with existing fabrication machines.

There is obtained in this way an integrated circuit active component including, immediately under the top surface of the substrate, a first zone with one conductivity type and a second zone surrounding the first zone in the substrate and having a conductivity type different than that of the first zone. The second zone can be connected to extrinsic conductive components and the first zone can be connected to an extrinsic conductive component situated above the top surface of the substrate and having the two dopants determining the conductivity types of the first and second zones.

For example, sublayers 10 and 12 can be provided containing arsenic to a concentration of 5E20 and a sublayer 11 can be provided containing boron to a concentration of 1E20.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method of fabricating an integrated circuit including a monocrystalline silicon substrate having a top surface, the method comprising:

forming at least one layer of polycrystalline silicon in direct contact with a top surface of a monocrystalline silicon substrate, wherein the polycrystalline silicon is doped with at least two dopants with different rates of diffusion; and annealing the polycrystalline silicon at a temperature and for a time such that a first dopant of the at least two dopants diffuses into a first zone and a second dopant of the at least two dopants diffuses into a second zone larger than the first zone, and the first dopant having a higher concentration in the first zone.

2. The method according to claim 1, further comprising:

forming a buried layer in the monocrystalline silicon substrate prior to forming at least one layer of polycrystalline silicon.

3. The method according to claim 1, wherein the method of fabricating an integrated circuit includes fabricating a bipolar transistor.

4. The method according to claim 2, wherein the method of fabricating an integrated circuit includes fabricating a bipolar transistor.

5. The method according to claim 1, wherein the method of fabricating an integrated circuit includes fabricating a diode.

6. The method according to claim 2, wherein the method of fabricating an integrated circuit includes fabricating a diode.

7. The method according to claim 3, wherein the annealing the polycrystalline silicon includes forming an intrinsic emitter and an intrinsic base.

8. The method according to claim 4, wherein the annealing the polycrystalline silicon includes forming an intrinsic emitter and an intrinsic base.

9. The method according to claim 7, wherein the annealing the polycrystalline silicon includes forming an extrinsic base in a third zone adjacent to a second zone which includes the intrinsic base.

10. The method according to claim 8, wherein the annealing the polycrystalline silicon includes forming an extrinsic base in a third zone adjacent to a second zone which includes the intrinsic base.

11. The method according to 1 claim, further comprising:
forming a stack having an emitter window;
wherein the forming the at least one layer of polycrystalline silicon includes:
a first sublayer doped with a first dopant and in contact with the top surface of the monocrystalline silicon substrate in a bottom portion of the emitter window;
a second sublayer doped with a second dopant; and
a third sublayer doped with the first dopant;
wherein the at least one layer of polycrystalline silicon is etched away except in the emitter window and an adjoining region.

12. The method according to 7 claim, further comprising:
forming a stack having an emitter window;
wherein the forming the at least one layer of polycrystalline silicon includes:
a first sublayer doped with a first dopant and in contact with the top surface of the monocrystalline silicon substrate in a bottom portion of the emitter window;
a second sublayer doped with a second dopant; and
a third sublayer doped with the first dopant;
wherein the at least one layer of polycrystalline silicon is etched away except in the emitter window and an adjoining region.

13. The method according to 10 claim, further comprising:
forming a stack having an emitter window;
wherein the forming the at least one layer of polycrystalline silicon includes:
a first sublayer doped with a first dopant and in contact with the top surface of the monocrystalline silicon substrate in a bottom portion of the emitter window;
a second sublayer doped with a second dopant; and
a third sublayer doped with the first dopant;
wherein the at least one layer of polycrystalline silicon is etched away except in the emitter window and an adjoining region.

14. The method according to claim 11, further comprising:
forming a supplementary sublayer of undoped polycrystalline silicon in the at least one layer of polycrystalline silicon, between the first sublayer and the second sublayer.

15. The method according to claim 11, wherein at least the first sublayer is doped at the same time as the at least one layer of polycrystalline silicon is formed.

16. The method according to claim 14, wherein at least the first sublayer is doped at the same time as the at least one layer of polycrystalline silicon is formed.

17. The method according to claim 1, wherein the annealing is performed in a single step.

18. The method according to claim 1, wherein the annealing is performed in multiple steps.

19. An integrated circuit with a monocrystalline silicon substrate treated in accordance with the method of claim 1.

20. An integrated circuit with a monocrystalline silicon substrate treated in accordance with the method of claim 16.

* * * * *

UNITED STATES PATENT AND TRADEMARK OFFICE
CERTIFICATE OF CORRECTION

PATENT NO. : 6,673,703 B2
DATED : January 6, 2004
INVENTOR(S) : Olivier Menut et al.

Page 1 of 1

It is certified that error appears in the above-identified patent and that said Letters Patent is hereby corrected as shown below:

<u>Title page, Item [54] and Column 1, line 1,</u>
Title, should read as follows:
-- METHOD OF FABRICATING AN INTEGRATED CIRCUIT AND AN INTEGRATED CIRCUIT WITH A MONOCRYSTALLINE SILICON SUBSTRATE --

Signed and Sealed this

Twenty-third Day of March, 2004

JON W. DUDAS
*Acting Director of the United States Patent and Trademark Office*